US006927007B2

(12) United States Patent
Takeuchi et al.

(10) Patent No.: US 6,927,007 B2
(45) Date of Patent: Aug. 9, 2005

(54) HEAT-SENSITIVE RECORDING MATERIAL

(75) Inventors: Yohsuke Takeuchi, Shizuoka-ken (JP); Akinori Fujita, Shizuoka-ken (JP); Daisuke Arioka, Shizuoka-ken (JP); Tetsunori Matsushita, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 91 days.

(21) Appl. No.: 10/692,653

(22) Filed: Oct. 27, 2003

(65) Prior Publication Data

US 2004/0086798 A1 May 6, 2004

(30) Foreign Application Priority Data

Oct. 28, 2002 (JP) ....................................... 2002-312938

(51) Int. Cl.[7] ................................................ G03F 7/016
(52) U.S. Cl. ........................ 430/138; 430/157; 430/163; 430/182; 430/183; 430/187
(58) Field of Search ................................ 430/138, 157, 430/163, 182, 183, 187

(56) References Cited

U.S. PATENT DOCUMENTS

| | | | | |
|---|---|---|---|---|
| 4,400,458 A | * | 8/1983 | Walkow et al. | 430/157 |
| 4,590,263 A | * | 5/1986 | Desjarlais et al. | 534/558 |
| 5,638,850 A | * | 6/1997 | Hazinski et al. | 135/120.1 |

FOREIGN PATENT DOCUMENTS

| | | | | |
|---|---|---|---|---|
| JP | 54-3363 | | 2/1979 | |
| JP | 59104995 A | * | 6/1984 | B41M/5/18 |
| JP | 09-160168 A | | 6/1997 | |
| JP | 09-216468 A | | 8/1997 | |
| JP | 09-216469 A | | 8/1997 | |

* cited by examiner

*Primary Examiner*—John S. Chu
(74) *Attorney, Agent, or Firm*—Sughrue Mion, PLLC

(57) ABSTRACT

A heat-sensitive recording material including a substrate having disposed thereon a heat-sensitive recording layer containing a diazo compound and a coupler compound capable of reacting with the diazo compound to develop color, wherein the coupler compound includes at least one of anilide derivatives represented by the following formula (1) or tautomers thereof:

Formula (1)

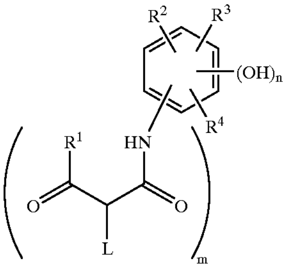

wherein $R^1$ represents an alkyl group or an aryl group; $R^2$, $R^3$ and $R^4$ each independently represent a hydrogen atom, a halogen atom, an alkyl group, an aryl group, an acyl group, an alkoxy group, an alkoxycarbonyl group, a hydroxycarbonyl group, an aminocarbonyl group, an acylamino group, a cyano group, a nitro group, an arylthio group or an alkylthio group; L represents a group which can leave upon coupling with the diazo compound; m represents 1 or 2; and n represents 1 or 2.

20 Claims, No Drawings

HEAT-SENSITIVE RECORDING MATERIAL

CROSS-REFERENCE TO RELATED APPLICATION

This application claims priority under 35 USC 119 from Japanese Patent Application No. 2002-312938, the disclosure of which is incorporated by reference herein.

BACKGROUND OF THE INVENTION

1. Field of the Invention

The present invention relates to a recording material that utilizes the photosensitivity of a diazo compound. More specifically, the invention relates to a yellow color-forming type heat-sensitive recording material that has improved color forming property and raw stock storability.

2. Description of the Related Art

Advancements in the performance of the heat-sensitive recording materials have led to a strong demand for a diazo heat-sensitive recording material prepared using a diazonium salt compound and a coupler to exhibit yellow color-forming property as well as improved raw stock storability and color density.

Recording materials that utilize the photosensitivity of the diazonium salt compound may be roughly classified into three types: a wet developing type, a dry developing type, and a thermal developing type. Among these types, the thermal developing type has an advantage in storage since this type, unlike the wet developing type or the dry developing type, obviates use of a developer.

Heat-sensitive recording materials must be able to suppress color formation in the background area during raw stock storage and a decrease in color density as much as possible. If the material is designed to sufficiently develop color and obtain high density even under low heating temperatures, color developing reaction tends to occur during raw stock storage even at room temperature, leading to a phenomenon of developing color in the background area which should remain white.

In order to solve the above problem, use of a specific anilide derivative as a coupler compound has been proposed. An example of this can be found in Japanese Patent Application Publication (JP-B) No. 54-3363, which proposes the preparation of a photosensitive material using a malonic acid anilide derivative as the coupler compound. Although this photosensitive material has improved storability, color density is unsatisfactory.

There has also been proposed for the preparation of heat-sensitive recording materials using, as the coupler compound, an anilide derivative in which a particular functional group is introduced into an oil-soluble group (e.g., Japanese Patent Application Laid-Open (JP-A) Nos. 9-160168, 9-216468 and 9-216469). Although these heat-sensitive recording materials provide constant effects in improved color density and raw stock storability in the background area, a further improvement is desired.

As described above, the current situation is that a satisfactory heat-sensitive recording material, which exhibits yellow color-forming property, suppresses color formation in the background area during raw stock storage, and has excellent color density, has yet to be obtained.

SUMMARY OF THE INVENTION

The present invention was accomplished in view of the foregoing. Therefore, an object of the invention is to provide a yellow color-forming type diazo heat-sensitive recording material that has improved pre-recording storability (raw stock storability) in the background area, and has excellent color forming property.

In order to attain the above object, the present inventors conducted intensive research, particularly focusing on a coupler compound and a diazo compound, and found that a desired heat-sensitive recording material that has improved storability in the background area and color forming property as well as excellent yellow color-forming property can be obtained by the following means.

The present invention provides a heat-sensitive recording material which comprises a substrate having disposed thereon a heat-sensitive recording layer containing a diazo compound and a coupler compound capable of reacting with the diazo compound to develop color, wherein the coupler compound includes at least one of anilide derivatives represented by the following formula (1) or tautomers thereof:

Formula (1)

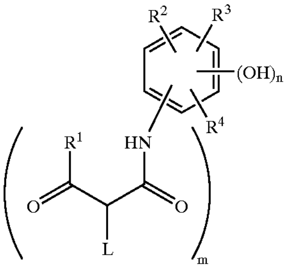

wherein $R^1$ represents an alkyl group or an aryl group; $R^2$, $R^3$ and $R^4$ each independently represent a hydrogen atom, a halogen atom, an alkyl group, an aryl group, an acyl group, an alkoxy group, an alkoxycarbonyl group, a hydroxycarbonyl group, an aminocarbonyl group, an acylamino group, a cyano group, a nitro group, an arylthio group or an alkylthio group; L represents a group which can leave upon coupling with the diazo compound; m represents 1 or 2; and n represents 1 or 2.

In the heat-sensitive recording material of the invention, it is preferable that the diazo compound is a compound represented by the following formula (2):

Formula (2)

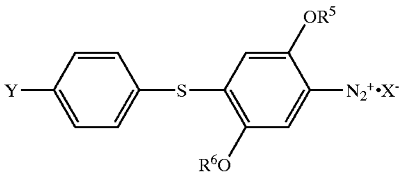

wherein Y represents a hydrogen atom, a halogen atom, an alkyl group, an alkoxy group or an aryloxy group; $R^5$ and $R^6$ each independently represent an alkyl group; and $X^-$ represents an acid anion.

DETAILED DESCRIPTION OF THE INVENTION

A heat-sensitive recording material of the present invention comprises a substrate having disposed thereon a heat-sensitive recording layer containing a diazo compound and a coupler compound capable of reacting with the diazo compound to develop color, wherein the coupler compound includes at least one of anilide derivatives represented by the following formula (1) or tautomers thereof:

Formula (1)

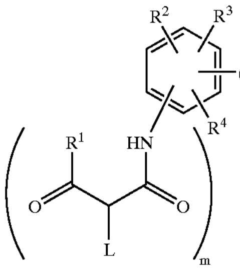

wherein $R^1$ represents an alkyl group or an aryl group; $R^2$, $R^3$ and $R^4$ each independently represent a hydrogen atom, a halogen atom, an alkyl group, an aryl group, an acyl group, an alkoxy group, an alkoxycarbonyl group, a hydroxycarbonyl group, an aminocarbonyl group, an acylamino group, a cyano group, a nitro group, an arylthio group or an alkylthio group; L represents a group which can leave upon coupling with the diazo compound; m represents 1 or 2; and n represents 1 or 2.

The term "tautomer" as used herein encompasses isomers of the anilide derivative represented by formula (1) whose structures are mutually changed easily:

Formula (1)

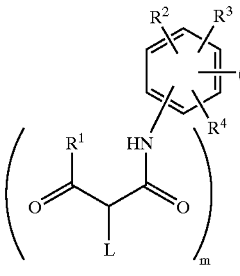

In formula (1), $R^1$ represents an alkyl group or an aryl group; $R^2$, $R^3$ and $R^4$ each independently represent a hydrogen atom, a halogen atom, an alkyl group, an aryl group, an acyl group, an alkoxy group, an alkoxycarbonyl group, a hydroxycarbonyl group, an aminocarbonyl group, an acylamino group, a cyano group, a nitro group, an arylthio group or an alkylthio group; L represents a group which can leave upon coupling with the diazo compound; m represents 1 or 2; and n represents 1 or 2.

First, the anilide derivative represented by formula (1) is described in detail.

As the alkyl group represented by $R^1$ in formula (1), an alkyl group having a total of 1 to 10 carbon atoms is preferable. Examples thereof include a methyl group, an ethyl group, a propyl group, a butyl group, a t-butyl group, a 1-methylcyclopropyl group, a 1-ethylcyclopropyl group and a trifluoromethyl group. From the standpoint of effects, a methyl group, a t-butyl group, a 1-methylcyclopropyl group and a trifluoromethyl group are preferable.

In formula (1), as an aryl group represented by $R^1$, an aryl group having a total of 6 to 20 carbon atoms is preferable. Examples thereof include a phenyl group, a tolyl group and a methoxyphenyl group, and from the standpoint of effects, a phenyl group is preferable.

In formula (1), examples of the halogen atom represented by $R^2$, $R^3$ and $R^4$ include a chlorine atom, a fluorine atom and an iodine group, and from the standpoint of effects, a chlorine atom is preferable.

In formula (1), as an alkyl group represented by $R^2$, $R^3$ and $R^4$, an alkyl group having a total of 1 to 10 carbon atoms is preferable. Examples thereof include a methyl group, an ethyl group, a propyl group, a butyl group, a t-butyl group, a 1-methylcyclopropyl group, a 1-ethylcyclopropyl group and a trifluoromethyl group, and from the standpoint of effects, a methyl group, a t-butyl group, a 1-methylcyclopropyl group and a trifluoromethyl group are preferable.

In formula (1), as an aryl group represented by $R^2$, $R^3$ and $R^4$, an aryl group having a total of 6 to 20 carbon atoms is preferable. Examples thereof include a phenyl group, a tolyl group and a methoxyphenyl group, and from the standpoint of effects, a phenyl group is preferable.

In formula (1), as an acyl group represented by $R^2$, $R^3$ and $R^4$, an acyl group having a total of 2 to 18 carbon atoms is preferable. Examples thereof include an acetyl group, a pivaloyl group, an octanoyl group and a stearoyl group, and from the standpoint of effects, an acetyl group, a pivaloyl group, and an octanoyl group are preferable.

In formula (1), as an alkoxy group represented by $R^2$, $R^3$ and $R^4$, an alkoxy group having a total of 1 to 18 carbon atoms is preferable. Examples thereof include a methoxy group, an ethoxy group, a butoxy group, an octyloxy group, a nonyloxy group, a dodecyloxy group, a 2-methoxyethoxy group and a 2-phenoxyethoxy group, and from the standpoint of effects, a methoxy group, a butoxy group, a nonyloxy group and a dodecyloxy group are preferable.

In formula (1), as an alkoxycarbonyl group represented by $R^2$, $R^3$ and $R^4$, an alkoxycarbonyl group having a total of 1 to 19 carbon atoms is preferable. Examples thereof include a methoxycarbonyl group, an ethoxycarbonyl group, a butoxycarbonyl group, an octyloxycarbonyl group, a nonyloxycarbonyl group, a decyloxycarbonyl group, a dodecyloxycarbonyl group, 2-methoxyethoxycarbonyl group and a 2-phenoxyethoxycarbonyl group, and from the standpoint of effects, a butoxycarbonyl group, a nonyloxycarbonyl group, a decyloxycarbonyl group and a dodecyloxycarbonyl group are preferable.

In formula (1), as an aminocarbonyl group represented by $R^2$, $R^3$ and $R^4$, an aminocarbonyl group having a total of 1 to 19 carbon atoms is preferable. Examples thereof include a methylaminocarbonyl group, a dimethylaminocarbonyl group, a butylaminocarbonyl group, a dibutylaminocarbonyl group, an octylaminocarbonyl group, a decylaminocarbonyl group, a dodecylaminocarbonyl group, a 3-(4-methyldiphenyl)aminocarbonyl group and an aminocarbonyl group, and from the standpoint of effects, a dimethylaminocarbonyl group and a dibutylaminocarbonyl group are preferable.

In formula (1), as an acylamino group represented by $R^2$, $R^3$ and $R^4$, an acylamino group having a total of 1 to 18 carbon atoms is preferable. Examples thereof include an acetylamino group, a pivaloylamino group, an octanoylamino group and a stearoylamino group, and from the standpoint of effects, an acetylamino group, a pivaloylamino group and an octanoylamino group are preferable.

In formula (1), as an arylthio group represented by $R^2$, $R^3$ and $R^4$, an arylthio group having a total of 6 to 18 carbon atoms is preferable. Examples thereof include a phenylthio group, a tolylthio group, a naphthylthio group, a 2-chlorophenylthio group, a 4-chlorophenylthio group, a 4-nitrophenylthio group and a 4-acetylaminophenylthio group, and from the standpoint of effects, a phenylthio group, a tolylthio group and a 4-chlorophenylthio group are preferable.

In formula (1), as an alkylthio group represented by $R^2$, $R^3$ and $R^4$, an alkylthio group having a total of 1 to 12 carbon atoms is preferable. Examples thereof include a methylthio group, an ethylthio group, a butylthio group, an octylthio group and a dodecylthio group, and from the standpoint of effects, a methylthio group, a butylthio group and a dodecylthio group are preferable.

In formula (1), examples of the group which can leave upon coupling with the diazo compound represented by L include a hydrogen atom, a halogen atom, an aromatic azo group, an alkyl, aryl or heterocyclic group which binds to a coupling site via an oxygen, nitrogen, sulfur or carbon atom, an alyl or arylsulfonyl group, an arylsulfinyl group, an alkyl, aryl or heterocyclic carbonyl group or a heterocyclic group which binds to a coupling site via a nitrogen atom. Specific examples thereof include a hydrogen atom, a halogen atom, an alkoxy group, an aryloxy group, an acyloxy group, an alkyl or arylsulfonyloxy group, an acylamino group, an alkyl or arylsulfonamide group, an alkoxycarbonyloxy group, an aryloxycarbonyloxy group, an alkyl, aryl or heterocyclicthio group, a carbamoylamino group, an arylsulfmyl group, an arylsulfonyl group, a 5-membered or 6-membered nitrogen-containing heterocyclic group, an imide group, and an arylazo group. An alkyl group or a heterocyclic group contained in these leaving groups may further be substituted with a substituent such as an alkoxy group, an aryloxy group, a halogen atom, an alkoxycarbonyl group, and an alkylcarbonyloxy group.

In formula (1), m represents 1 or 2. When m is 2, $R^1$ and L may be the same or different with each other.

In formula (1), n represents 1 or 2. In the anilide derivative represented by formula (1), from the standpoint of color forming property, it is preferable that an OH group introduced into the benzene ring relative to —NH—C(=O)—CH(L)—C(=O)—$R^1$ is at the ortho position when m is 1 and n is 1. When m is 1 and n is 2, it is preferable that any one of OH groups is at the ortho position. When m is 2 and n is 1, the OH group relative to any one of —NH—C(=O)—CH(L)—C(=O)—$R^1$s is preferably at the ortho position. When m is 2 and n is 2, it is preferable that any one of OH groups is at the ortho position relative to any one of —NH—C(=O)—CH(L)—C(=O)—$R^1$s.

In formula (1), $R^1$ to $R^4$ may further be substituted with a substituent, and examples of the substituent include those as defined for $R^2$ to $R^4$.

Illustrative compounds 1-1 to 1-36 are shown below as specific examples of the anilide derivative represented by formula (1) of the invention, but the invention is not limited thereto.

1-1

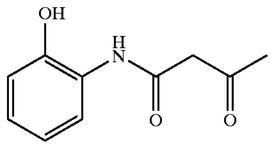

1-2

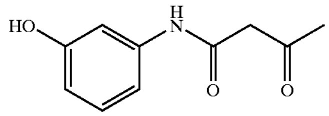

1-3

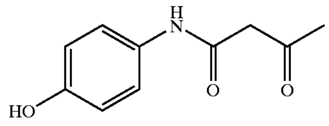

1-4

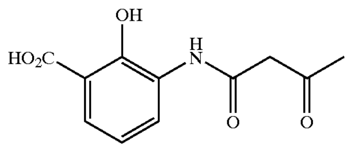

1-5

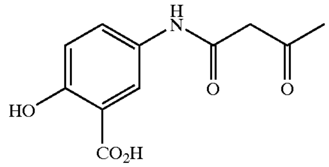

1-6

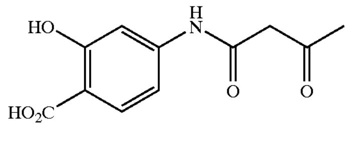

1-7

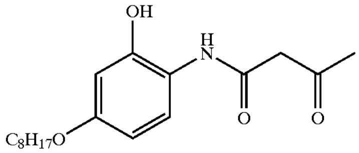

1-8

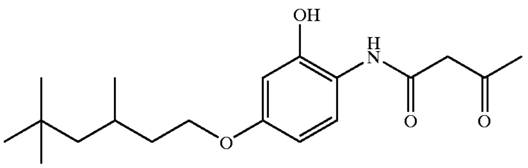

-continued
1-9
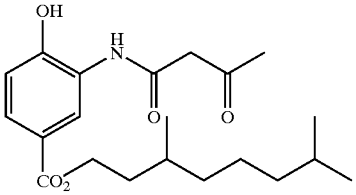
1-10
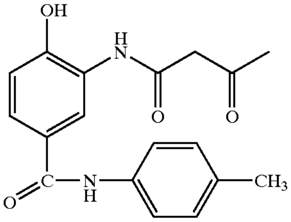
1-11
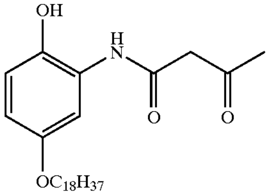
1-12
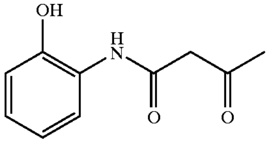
1-13
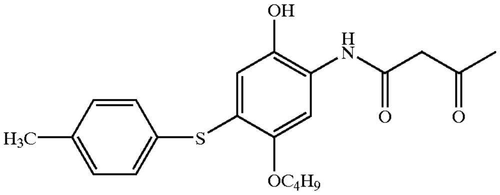
1-14
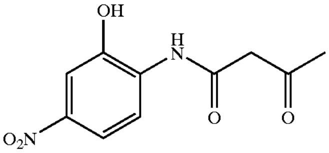
1-15
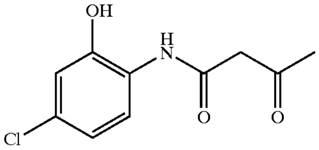
1-16
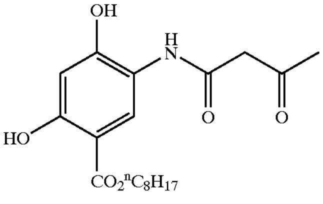
-continued
1-17
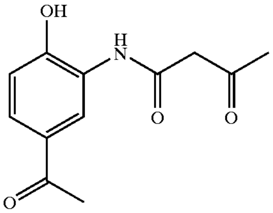
1-18
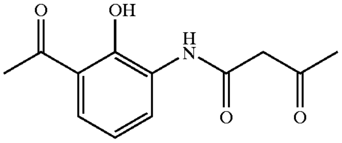
1-19
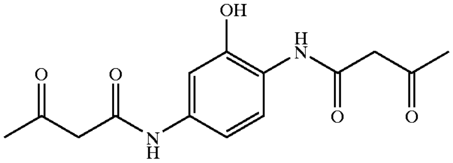
1-20
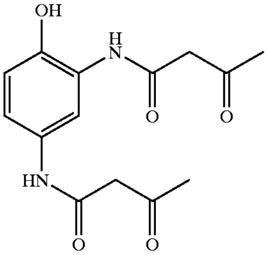
1-21
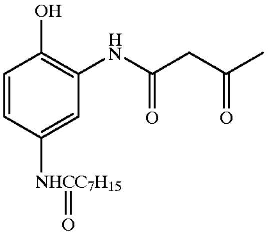
1-22
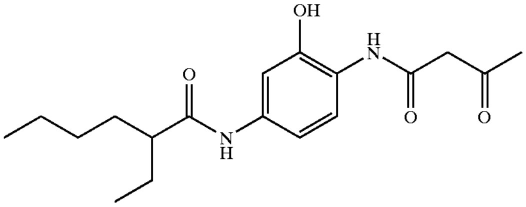
1-23
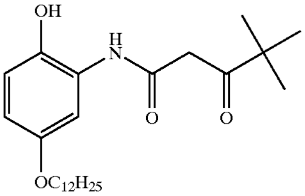

-continued 1-24

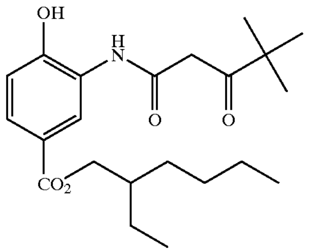

1-25

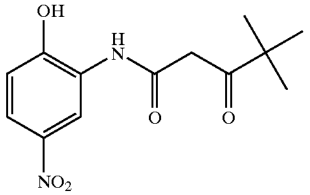

1-26

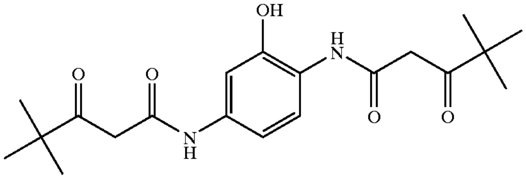

1-27

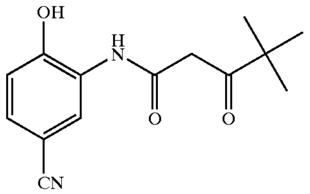

1-28

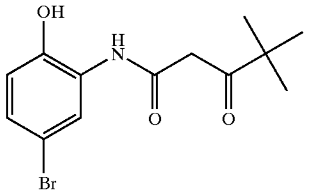

1-29

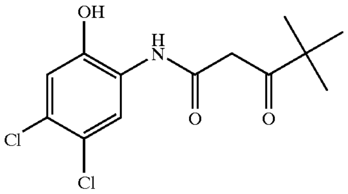

1-30

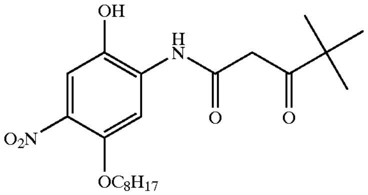

-continued 1-31

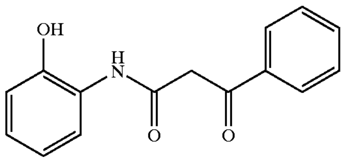

1-32

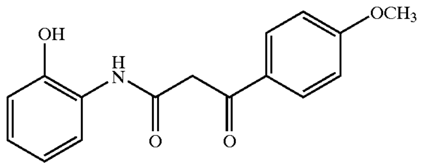

1-33

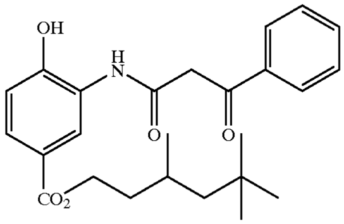

1-34

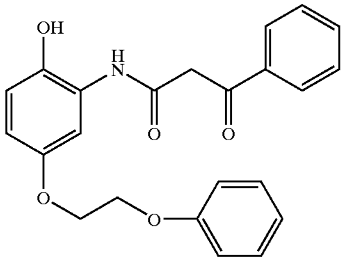

1-35

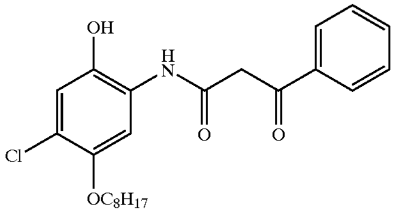

1-36

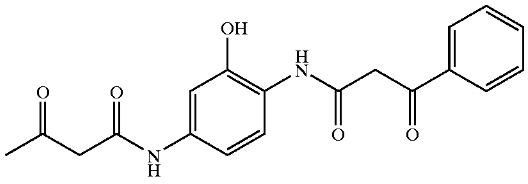

These anilide derivatives represented by formula (1) may be synthesized by conventionally known methods. A synthesis example of an illustrative compound 1-8 is described below.

11.3 g of 2-hydroxy-4-(3,5,5-trimethylhexyloxy)aniline was dissolved in 50 ml of acetonitrile at room temperature, to which was added 4.2 g of diketene. After a reaction was allowed to proceed for 5 hours, the solvent was evaporated off under reduced pressure, followed by purification using silica gel column. To the resultant product was added hexane and subjected to crystallization to thereby obtain 6.0 g of an object compound (yield: 40%).

The results of $^1$H-NMR measurement of the obtained compound are shown below.

δH ($CDCl_3$): 9.6 (1H), 8.9 (1H), 6.9 (1H), 6.6 (1H), 6.5 (1H), 4.0 (2H), 3.6 (2H), 2.4 (3H), 1.8–1.6 (3H), 1.3–1.1 (2H), 1.0 (3H), 0.9 (9H)

These anilide derivatives represented by formula (1) may be used alone, or in combination of two or more thereof. It is preferable that an addition amount of these anilide derivatives ranges from 0.02 to 5 g/$m^2$ in a heat-sensitive recording layer, from the standpoint of color forming property and coating suitability. From the standpoint of effects, it is more preferable that the anilide derivatives are used in a range of 0.1 to 4 g/$m^2$.

Also, conventionally known coupler compounds may be used in combination with the anilide derivatives represented by formula (1) of the invention. In this case, a use amount of the coupler compound including the amount of the anilide derivative represented by formula (1) preferably ranges from 1 to 30 mole relative to 1 mole of the diazo compound described below.

The anilide derivative represented by formula (1) of the invention and conventionally known coupler compounds may be used, by adding thereto a water-soluble polymer with other components and dispersing them using a sand mill or the like. Alternatively, they may be used as an emulsion together with an appropriate emulsifying auxiliary. A solid dispersing method and an emulsifying method are not particularly limited, but conventionally known methods may be used. The details of these methods are described in JP-A Nos. 59-190886, 2-141279 and 7-17145.

In the heat-sensitive recording material of the invention, the diazo compound is preferably a compound represented by the following formula (2).

Formula (2)

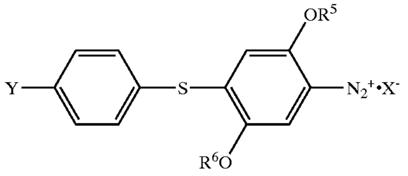

In formula (2), Y represents a hydrogen atom, a halogen atom, an alkyl group, an alkoxy group or an aryloxy group. $R^5$ and $R^6$ each independently represent an alkyl group; and $X^-$ represents an acid anion.

Next, the diazo compound represented by formula (2) is described in detail below.

In formula (2), as a halogen atom represented by Y, a chlorine atom, a fluorine atom, a bromine atom and the like are preferable, with a chlorine atom and a fluorine atom being more preferable from the standpoint of effects.

In formula (2), as an alkyl group represented by Y, a methyl group, an ethyl group, a propyl group, a butyl group and the like are preferable, with a methyl group and an ethyl group being more preferable from the standpoint of effects.

In formula (2), as an alkoxy group represented by Y, a methoxy group, an ethoxy group, a propoxy group, a butoxy group and the like are preferable, with a methoxy group and an ethoxy group being more preferable from the standpoint of effects.

In formula (2), as an aryloxy group represented by Y, a phenoxy group, a methoxyphenoxy group, a chlorophenoxy group and the like are preferable, with a phenoxy group being more preferable from the standpoint of effects.

In formula (2), as an alkyl group represented by $R^5$ and $R^6$, a methyl group, an ethyl group, a propyl group, a butyl group, a pentyl group, an s-pentyl group, a 2-ethylhexyl group and the like are preferable, with a propyl group, a butyl group and a pentyl group being more preferable from the standpoint of effects. Further, as $R^5$ or $R^6$, an allyl group is also suitably used as a substituted alkyl group. A total number of carbon atoms of $R^5$ and $R^6$ is preferably 6 or greater, more preferably 8 or greater.

In formula (2), examples of the counter anion represented by $X^-$ include a polyfluoroalkylcarboxylic acid ion, a polyfluoroalkylsulfonic acid ion, a tetrafluoroboric acid ion and a hexafluorophosphoric acid ion, with a tetrafluoroboric acid ion and a hexafluorophosphoric acid ion being preferable since these ions are low in solubility in water and soluble in an organic solvent.

The diazo compounds represented by formula (2) include the compounds described in JP-A No. 7-96671. It is preferable that a melting point thereof ranges from 30 to 200° C. In view of readily handling, a melting point of from 50 to 150° C. is preferable.

In the invention, the diazo compound is used at a range of 0.02 to 3 g/$m^2$ in a heat-sensitive recording layer, and is preferably used at a range of 0.1 to 2 g/$m^2$ from the standpoint of effects.

In the invention, in view of storability, it is preferable that the diazo compound is contained in microcapsules. A micro-encapsulating method is not particularly limited, but encapsulation may be performed using a wall material such as gelatin, polyurea, polyurethane, polyimide, polyester, polycarbonate and melamine through conventionally known methods. In the invention, it is preferable that the wall material contains polyurethane and/or polyurea as a constituting component. The details of a micro-encapsulating method are described in JP-A No. 2-141279.

In addition, a high boiling point organic solvent may be used as a solvent for dispersing the diazo compound upon encapsulation. This organic solvent is not particularly limited, and conventionally known solvents such as alkyl phthalate, phosphoric acid ester, citric acid ester, benzoic acid ester, alkylamide, aliphatic ester and trimesic acid ester may be used. The details thereof are described in JP-A No. 7-17145.

As examples of the diazo compound represented by formula (2) of the invention, illustrative compounds 2-1 to 2-10 are shown below, but the invention is not limited thereto.

(2-1)

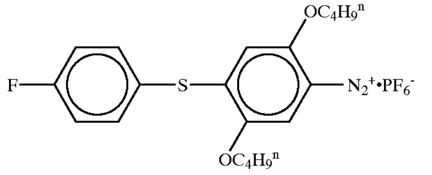

(2-2)

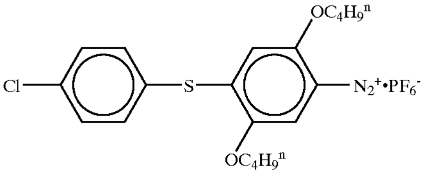

(2-3)

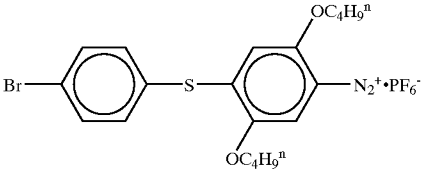

(2-4)

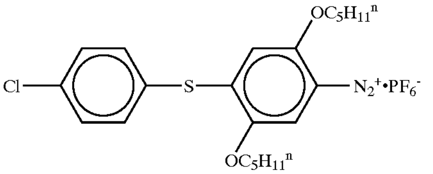

(2-5)

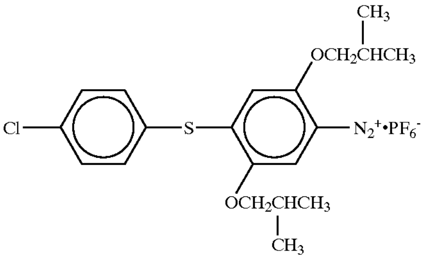

(2-6)

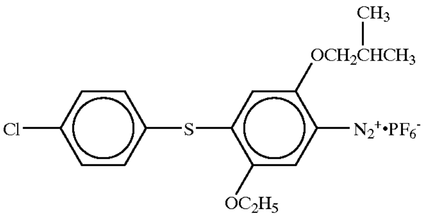

(2-7)

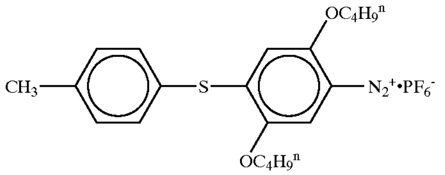

(2-8)

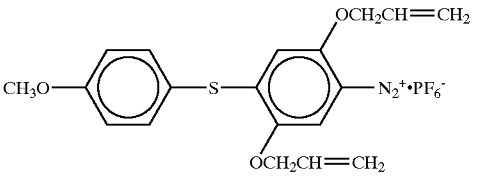

-continued (2-9)

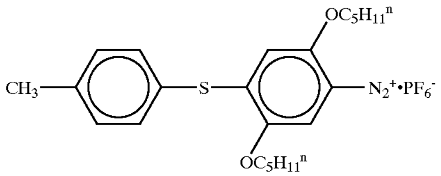

(2-10)

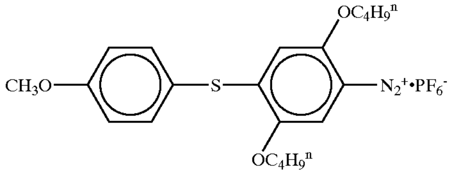

In the invention, for the purpose of making the system to become basic such that a coupling reaction can be accelerated when conducting thermal development, it is preferable to use basic substances such as tertiary amines, piperizines, piperazines, amidines, formamidines, pyridines, guanidines and morpholines in combination with the anilide derivative represented by formula (1) of the invention.

Examples of these basic substances include piperazines such as N,N'-bis(3-phenoxy-2-hydroxypropyl)piperazine, N,N'-bis[3-(p-methylphenoxy)-2-hydroxypropyl] piperazine, N,N'-bis[3-(p-methoxyphenoxy)-2-hydroxypropyl]piperazine, N,N'-bis(3-phenylthio-2-hydroxypropyl)piperazine, N,N'-bis[3-(β-naphthoxy)-2-hydroxypropyl]piperazine, N-3-(β-naphthoxy)-2-hydroxypropyl-N'-methylpiperazine and 1,4-bis{[3-(N-methylpiperazino)-2-hydroxy]propyloxy}benzene; morpholines such as N-[3-(β-naphthoxy)-2-hydroxy] propylmorpholine, 1,4-bis[(3-morpholino-2-hydroxy) propyloxy]benzene and 1,3-bis [(3-morpholino-2-hydroxy) propyloxy]benzene; piperidines such as N-(3-phenoxy-2-hydroxypropyl)piperidine and N-dodecylpiperidine; triphenylguanidine, tricyclohexylguanidine, dicyclohexylphenylguanidine, 2-N-methyl-N-benzylaminoethyl 4-hydroxybenzoate, 2-N,N-di-n-butylaminoethyl 4-hydroxybenzoate, 4-(3-N,N-dibutylaminopropoxy)benzenesulfonamide, 4-(2-N,N-dibutylaminoethoxycarbonyl)phenoxyacetic acid amide, and the like. The details of thereof are described in JP-A Nos. 57-123086, 60-49991, 60-94381, 7-228731, 7-235157, 7-235158 and the like. These basic substances may be used alone or in combination of two or more thereof.

In the invention, a use amount of the basic substance is not particularly limited, but it is preferable to use the basic substance in an amount of 1 to 30 mole relative to 1 mole of the diazo compound.

In the invention, in addition to the anilide derivative represented by formula (1), a color forming auxiliary may be added in order to promote a color developing reaction. Examples of the color forming auxiliary include a phenol derivative, a naphthol derivative, alkoxy-substituted benzenes, alkoxy-substituted naphthalenes, a hydroxyl compound, a carboxylic acid amide compound and a sulfonamide compound. It is considered that these compounds can lower the melting point of a coupler compound or the basic substance, or improve heat transmissibility of the aforementioned microcapsule wall, and as a result, a high color density is obtained.

In the recording material of the invention, for the purpose of alleviating yellow color formation in the background area after recording, a free radical generator (a compound which generates free radicals by the action of irradiated light) and a polymerizable compound having an ethylenically unsaturated bond used in a photopolymerizable composition may be employed. The details thereof are described in JP-A No. 7-223368 and the like. Besides, various organic or inorganic pigments, various stabilizers, an antioxidant, and a compound having a function of controlling UV transmittance may be added, as necessary.

A binder usable in the invention is not particularly limited, but conventionally known binders such as polyvinyl alcohol, hydroxyethylcellulose, methylcellulose, carboxymethylcellulose, gelatin, styrene and acrylic acid copolymer may be used. The details thereof are described in JP-A No. 2-141279.

In order to produce the recording material of the invention, it is preferable that a coating solution containing the diazo compound, the anilide derivative represented by formula (1) and other additives is prepared, and the coating solution is coated on a substrate such as a paper and a synthetic resin film by a coating method such as bar coating, blade coating, air knife coating, gravure coating, roll coating, spray coating, dip coating, and curtain coating, and is dried to provide a heat-sensitive recording layer having solids content of 2 to 30 $g/m^2$.

In the recording material of the invention, the diazo compound, the anilide derivative represented by formula (1) and the like may be contained in the same layer as described in the above method, or a laminating construction may be adopted so as to contain them in separate layers. Alternatively, after an intermediate layer described in JP-A No. 61-54980 is provided on a substrate, a heat-sensitive recording layer may be coated.

As the substrate for use in the invention, conventionally known substrates may be employed. Specific examples thereof include a neutral paper, an acidic paper, a recycled paper, a polyolefin resin laminated paper, a synthetic paper, a polyester film, a cellulose derivative film such as a cellulose triacetate film and the like, a polystyrene film, and a polyolefin film such as a polypropyrene film and a polyethylene film. These may be used singly or by a laminating method. The substrate has a thickness preferably of 20 to 200$\mu$.

The heat-sensitive recording material of the invention may be used as a multicolor heat-sensitive recording material. When the material of the invention is used in a photofixation-type multicolor heat-sensitive recording material, effects of the invention such as raw stock storability in the background area, yellow color-forming property and excellent color density are considerably exhibited.

This multicolor heat-sensitive recording material (photosensitive heat-sensitive recording material) is described in JP-A Nos. 4-135787, 4-144784, 4-144785, 4-194842, 4-247447, 4-247448, 4-340540, 4-340541, 5-34860 and the like. Specifically, the multicolor heat-sensitive recording material is obtained by laminating plural heat-sensitive recording layers which develop mutually different color hues. The layer construction is not particularly limited, but in particular, a multicolor heat-sensitive recording material having two heat-sensitive recording layers (B layer and C layer) in which two kinds of diazo compounds having mutually different photosensitive wavelengths are combined with the coupler compounds which react by heat with respective diazo compounds to develop different color hues, which is laminated with another heat-sensitive recording layer containing an electron donating colorless pigment and an electron accepting compound in combination, is preferable. In more detail, the material comprises a substrate having disposed thereon a first heat-sensitive recording layer (A layer) containing an electron donating colorless pigment and an electron accepting compound, a second heat-sensitive recording layer (B layer) containing a diazo compound having a maximum absorption wavelength of 360 nm±20 nm and a coupler compound which reacts by heat with the diazo compound to develop color, and a third heat-sensitive recording layer (C layer) containing another diazo compound having a maximum absorption wavelength of 400±20 nm and another coupler compound which reacts by heat with the another diazo compound to develop color. In this example, when developing hues of respective heat-sensitive recording layers are selected so as to be three primary colors of yellow, magenta and cyan in subtractive color mixing, a full-color image recording becomes possible.

When a recording method using this multicolor heat-sensitive recording material is employed, a third heat-sensitive recording layer (C layer) is first heated to cause a reaction between the diazonium salt and the coupler compound contained in the layer to develop color. Then, after light of 400±20 nm is irradiated to degrade an unreacted diazo compound contained in the C layer, a sufficient heat is applied to a second heat-sensitive recording layer (B layer) to cause a reaction between the another diazo compound and the another coupler compound contained in the layer. At this point, the C layer is strongly heated simultaneously, but since the diazo compound has already been degraded and the color forming ability has been lost, the C layer no longer develop color. Further, light of 360±20 nm is irradiated to degrade the diazo compound contained in the B layer, and finally a sufficient heat is applied to the first heat-sensitive recording layer (A layer) to make the layer to develop color. At this point, the heat-sensitive recording C layer and B layer are also heated strongly simultaneously, but those layers do not develop color since the diazo compound has already been degraded, whereby color forming ability has been lost.

When an image is to be formed on the recording material of the invention, the following method may be employed. One method is to expose the material to light using a manuscript to form a latent image, and thereafter to irradiate other parts than this image forming portion with light to fix the image; and another method is to produce a thermally developed color image using a thermal pen, a thermal head or the like, and thereafter to irradiate other parts than the image forming portion with light to fix the image. Any of the methods may preferably be employed. As light sources for exposure, various florescent lamps, a xenon lamp and a mercury lamp are used. The light source whose emission spectrum is almost consistent with the absorption spectrum of the diazo compound used in a recording material is preferable since other parts than the image forming portion may effectively be photo-fixed. Further, in a step of thermally developing the material, a thermal pen, a thermal head, an infrared ray, a high frequency wave, a heating block, a heating roller and the like may be used as the heating means.

EXAMPLES

The present invention will now be described in more detail by way of Examples, but the invention is not limited thereto.

Example 1

Preparation of Capsule Solution A 2.8 g of the diazo compound described above as the specific example (illustrative compound 2-7) and 10 g of tricresyl phosphate were added to 19 g of ethyl acetate and thoroughly mixed. To the resultant mixture was added 7.6 g of Takenate D-110N (manufactured by Takeda Chemical Industries, Ltd.) as a wall material, and uniformly mixed to thereby obtain a solution I.

Then, the above solution I was added to a mixed solution containing 46.1 g of a 8% by mass aqueous phthalated gelatin solution, 17.5 g of water and 2 g of a 10% aqueous sodium dodecylbenzenesulfonate solution, and emulsifying dispersion was conducted at 10,000 rpm at 40° C. for 10 minutes. 20 g of water was added to the obtained emulsion to form a uniform solution, and an encapsulating reaction was caused at 40° C. for 3 hours with stirring, to prepare a capsule solution A. A particle diameter of the prepared capsules was 0.44 $\mu$m.

Preparation of Coupling Component/Base Emulsion B 2.4 g of the anilide derivative described above as the specific example (illustrative compound 1-9), 3.2 g of 2-ethylhexyl 4-hydroxybenzoate ester, 2.5 g of 1,1-bis(4-hydroxyphenyl)-2-ethylhexane, 3.5 g of 4,4'-(m-phenylenediisopropylidene)diphenol, 0.64 g of tricresyl phosphate and 0.32 g of diethyl maleate ester were dissolved in 8 g of ethyl acetate to thereby obtain a solution II.

Then, 32 g of a 15% by mass aqueous lime-processed gelatin solution, 5 g of a 10% aqueous sodium dodecylbenzenesulfonate solution and 30 g of water were thoroughly mixed at 40° C., to which was added the solution II, and emulsifying dispersing was conducted at 9,000 rpm for 10 minutes using a homogenizer. The resulting emulsion was stirred at 40° C. for 2 hours to remove ethyl acetate, followed by adding water to supplement a mass of ethyl acetate volatilized, to thereby obtain a coupling component/base emulsion B.

Preparation of Coating Solution C 6 g of the capsule solution A, 4.4 g of water and 1.9 g of a 15% by mass aqueous lime-processed gelatin solution were thoroughly mixed at 40° C., to which was added 8.3 g of a coupler compound/base emulsion B, and then uniformly mixed to prepare a coating solution C for the heat-sensitive recording layer.

Preparation of Coating Solution D for Protective Layer 32 g of a 10% by mass aqueous solution of polyvinyl alcohol (polymerization degree 1700, saponification degree 88%) and 36 g of water were thoroughly mixed to prepare a coating solution D for the protecting layer.

Coating

The coating solution C for the heat-sensitive recording layer and the coating solution D for the protecting layer were successively coated on a photographic paper substrate in which polyethylene was laminated on a high grade paper, using a wire bar, and then dried at 50° C. to produce a desired diazo heat-sensitive recording material. Coating amounts in terms of solids were 6.4 g/m$^2$ and 1.05 g/m$^2$, respectively.

Test of Color Development and Fixation

Thermal printing was conducted on a diazo heat-sensitive recording layer by applying a specified electric power and a pulse width to yield a recording energy per unit area of 40 mJ/mm$^2$ using a thermal head (Type KST, manufactured by Kyocera Corporation). After an image was formed, flood exposure was carried out by irradiating light using a UV lamp having a central wavelength of 420 nm and an output of 40 W for 15 seconds. The obtained samples were evaluated for density in the formed color area using a Macbeth densitometer. The results are shown in Table 1 below.

Test of Raw Stock Storability

A heat-sensitive recording material before recording was stored for use in an accelerated aging test at 60° C. and 30% RH for 72 hours. The samples of the material were evaluated for density in the background area before storage and after storage, respectively. The results are also shown in Table 1.

Example 2

The same procedures were carried out as in Example 1 [preparation of coupling component/base emulsion B], except that an illustrative compound 1-9 used as the anilide derivative was changed to an illustrative compound 1-8, to prepare a heat-sensitive recording material of Example 2. Evaluation was conducted as in Example 1 and the obtained results are shown in Table 1.

Example 3

The same procedures were carried out as in Example 1 [preparation of coupling component/base emulsion B], except that an illustrative compound 1-9 used as the anilide derivative was changed to an illustrative compound 1-13, to prepare a heat-sensitive recording material of Example 3. Evaluation was conducted as in Example 1 and the obtained results are shown in Table 1.

Example 4

The same procedures were carried out as in Example 1 [preparation of coupling component/base emulsion B], except that an illustrative compound 1-9 used as the anilide derivative was changed to an illustrative compound 1-24, to prepare a heat-sensitive recording material of Example 4. Evaluation was conducted as in Example 1 and the obtained results are shown in Table 1.

Comparative Example 1

The same procedures were carried out as in Example 1 [preparation of coupling component/base emulsion B], except that an illustrative compound 1-9 used as the anilide derivative was changed to 2,5-dimethoxy-4-chloroanilide 3-oxobutanoate, to prepare a heat-sensitive recording material of Comparative Example 1. Evaluation was conducted as in Example 1 and the obtained results are shown in Table 1.

Comparative Example 2

The same procedures were carried out as in Example 1 [preparation of coupling component/base emulsion B], except that an illustrative compound 1-9 used as the anilide derivative was changed to 2,5-diheptyloxyanilide 3-oxobutanoate, to prepare a heat-sensitive recording material of Comparative Example 2. Evaluation was conducted as in Example 1 and the obtained results are shown in Table 1.

Comparative Example 3

The same procedures were carried out as in Example 1 [preparation of coupling component/base emulsion B], except that an illustrative compound 1-9 used as the anilide derivative was changed to the following anilide derivative 1-37, to prepare a heat-sensitive recording material of Comparative Example 3. Evaluation was conducted as in Example 1 and the obtained results are shown in Table 1.

TABLE 1

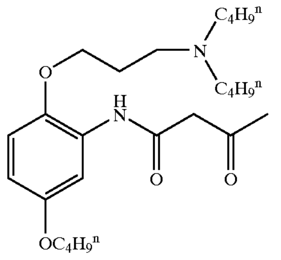

1-37

| | Color Density | Density in Background Area | |
|---|---|---|---|
| | | Before Storage | After Storage |
| Example 1 | 1.3 | 0.07 | 0.15 |
| Example 2 | 1.5 | 0.07 | 0.12 |
| Example 3 | 1.2 | 0.08 | 0.13 |
| Example 4 | 1.1 | 0.07 | 0.11 |
| Comparative Example 1 | 1.2 | 0.12 | 0.20 |
| Comparative Example 2 | 0.8 | 0.07 | 0.10 |
| Comparative Example 3 | 0.9 | 0.07 | 0.16 |

As apparent from the results shown in Table 1, it is revealed that yellow color-forming type heat-sensitive recording materials which were prepared using the anilide derivative represented by formula (1) of the invention exhibit high color density and excellent storability in the background area.

As detailed above, the present invention can provide a yellow color-forming type diazo heat-sensitive recording material which has improved pre-recording storability (raw stock storability) in the background area and excellent color forming property.

What is claimed is:

1. A heat-sensitive recording material comprising a substrate having disposed thereon a heat-sensitive recording layer containing a diazo compound and a coupler compound capable of reacting with the diazo compound to develop color, wherein the coupler compound includes at least one of anilide derivatives represented by the following formula (1) or tautomers thereof:

Formula (1)

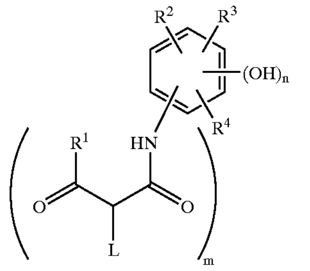

wherein $R^1$ represents an alkyl group or an aryl group; $R^2$, $R^3$ and $R^4$ each independently represent a hydrogen atom, a halogen atom, an alkyl group, an aryl group, an acyl group, an alkoxy group, an alkoxycarbonyl group, a hydroxycarbonyl group, an aminocarbonyl group, an acylamino group, a cyano group, a nitro group, an arylthio group or an alkylthio group; L represents a group which can leave upon coupling with the diazo compound; m represents 1 or 2; and n represents 1 or 2.

2. The heat-sensitive recording material according to claim 1, wherein the diazo compound is a compound represented by the following formula (2):

Formula (2)

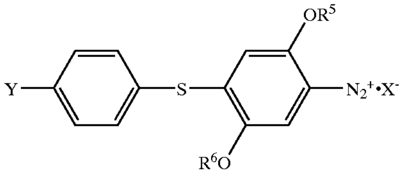

wherein Y represents a hydrogen atom, a halogen atom, an alkyl group, an alkoxy group or an aryloxy group; $R^5$ and $R^6$ each independently represent an alkyl group; and $X^-$ represents an acid anion.

3. The heat-sensitive recording material according to claim 1, wherein the diazo compound is encapsulated in a microcapsule.

4. The heat-sensitive recording material according to claim 2, wherein the diazo compound is encapsulated in a microcapsule.

5. The heat-sensitive recording material according to claim 1, further comprising a basic substance.

6. The heat-sensitive recording material according to claim 2, further comprising a basic substance.

7. The heat-sensitive recording material according to claim 3, wherein a capsule wall forming the microcapsule contains at least one of polyurethane or polyurea.

8. The heat-sensitive recording material according to claim 4, wherein a capsule wall forming the microcapsule contains at least one of polyurethane or polyurea.

9. The heat-sensitive recording material according to claim 1, wherein the anilide derivative is contained at a range of 0.02 to 5 $g/m^2$ in the heat-sensitive recording layer.

10. The heat-sensitive recording material according to claim 1, wherein the coupler compound including the anilide derivative represented by formula (1) is contained at a range of 1 to 30 mole relative to 1 mole of the diazo compound.

11. The heat-sensitive recording material according to claim 2, wherein the diazo compound represented by formula (2) has a melting point in a range of 30° C. to 200° C.

12. The heat-sensitive recording material according to claim 2, wherein the diazo compound represented by formula (2) is contained at a range of 0.02 to 3 $g/m^2$ in the heat-sensitive recording layer.

13. The heat-sensitive recording material according to claim 5, wherein the basic substance is selected from the group consisting of tertiary amines, piperidines, piperazines, amidines, formamidines, pyridines, guanidines and morpholines.

14. The heat-sensitive recording material according to claim 6, wherein the basic substance is selected from the group consisting of tertiary amines, piperidines, piperazines, amidines, formamidines, pyridines, guanidines and morpholines.

15. The heat-sensitive recording material according to claim 5, wherein the basic substance is contained at a range of 1 to 30 mole relative to 1 mole of the diazo compound.

16. The heat-sensitive recording material according to claim 6, wherein the basic substance is contained at a range of 1 to 30 mole relative to 1 mole of the diazo compound.

17. The heat-sensitive recording material according to claim 1, further comprising a color forming auxiliary.

18. The heat-sensitive recording material according to claim 17, wherein the color forming auxiliary is selected from the group consisting of a phenol derivative, a naphthol derivative, an alkoxy-substituted benzene, an alkoxy-substituted naphthalene, a hydroxy compound, a carboxylic acid amide compound and a sulfonamide compound.

19. The heat-sensitive recording material according to claim 1, further comprising a free radical generator.

20. The heat-sensitive recording material according to claim 1, wherein the substrate is selected from the group consisting of a neutral paper, an acidic paper, a recycled paper, a polyolefin resin laminated paper, a synthetic paper, a polyester film, a cellulose derivative film and a polyolefin film.

* * * * *